(12) United States Patent
Cho (10) Patent No.: US 7,471,227 B2
(45) Date of Patent: Dec. 30, 2008

(54) METHOD AND APPARATUS FOR DECREASING LAYOUT AREA IN A PIPELINED ANALOG-TO-DIGITAL CONVERTER

(75) Inventor: Taehee Cho, Irvine, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/506,702

(22) Filed: Aug. 18, 2006

(65) Prior Publication Data

US 2008/0042889 A1 Feb. 21, 2008

(51) Int. Cl.
*H03M 1/38* (2006.01)
(52) U.S. Cl. .................................. 341/161; 341/162
(58) Field of Classification Search ................. 341/161, 341/162, 163, 156, 155, 122
See application file for complete search history.

(56) References Cited

U.S. PATENT DOCUMENTS

| | | | | |
|---|---|---|---|---|
| 5,771,012 A | * | 6/1998 | Shu et al. ..................... | 341/118 |
| 7,002,507 B2 | * | 2/2006 | Kobayashi et al. ........... | 341/162 |
| 7,250,895 B2 | * | 7/2007 | Kurose et al. ................ | 341/155 |
| 7,324,036 B2 | * | 1/2008 | Petre et al. ................... | 341/155 |
| 2005/0156775 A1 | * | 7/2005 | Petre et al. ................... | 341/155 |

OTHER PUBLICATIONS

U.S. Appl. No. 11/211,566, filed Aug. 26, 2005, Cho et al.
Dallas Semiconductor Maxim, Mar. 1, 2001, found at http://www.maxim-ic.com/an1023.
B. Vaz, N. Paulino, J. Goes R. Costa, R. Tavares, A. Steiger-Garcao, Design of Low-Voltage CMOS Pipelined ADC's using 1 pico-Joule of Energy per Conversion, IEEE 2002.

* cited by examiner

*Primary Examiner*—Howard Williams
*Assistant Examiner*—Joseph Lauture
(74) *Attorney, Agent, or Firm*—Fletcher Yoder (57) ABSTRACT

In accordance with one embodiment, there is provided a pipelined analog-to-digital converter (ADC) device. The pipelined ADC includes a first stage and a second stage. The first and second stages are configured to share a sub-ADC and a sub-digital-to-analog converter.

25 Claims, 6 Drawing Sheets

METHOD AND APPARATUS FOR DECREASING LAYOUT AREA IN A PIPELINED ANALOG-TO-DIGITAL CONVERTER

BACKGOUND OF THE INVENTION

1. Field of the Invention

The present invention relates generally to analog-to-digital converters (ADCs). More particularly, the present invention relates to sub-ADCs and sub-DACs in a pipelined ADC architecture.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Analog-to-digital converters (ADCs) are common electrical components used in a wide variety of applications, including wireless communications and the digital recording industry. ADCs take continuous analog signals and convert them to digital signals, or signals with discrete parts, so that the signals can be rendered, stored, or manipulated. For example, in typical wireless communication systems, a transmitter will transmit an analog signal that is converted into a digital signal for processing.

Pipelined ADCs have been widely used because they can provide high resolution at high speeds. In a pipelined ADC architecture, multiple identical stages are used to achieve a desired resolution. The multiple stages provide redundancy of components, and, as such, may take up excessive layout area.

Attempts to reduce power consumption by sharing operational amplifiers between stages have been employed to reduce layout area in low speed applications. In high speed applications, however, such techniques may actually increase the layout area as the lower settling time required for high speed applications may necessitate larger components and higher power. Thus, the sharing of operational amplifiers may increase the power consumption of the ADC as well as the layout area required when used in high speed applications.

BRIEF DESCRIPTION OF THE DRAWINGS

Advantages of the invention may become apparent upon reading the following detailed description and upon reference to the drawings in which.

DETAILED DESCRIPTION

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

An analog-to-digital converter (ADC) having a reduced layout area is described herein, as well as techniques for implementing the ADC. The layout area is reduced by providing for the sharing of components by sequential stages. The following description sets forth techniques and exemplary embodiments for implementing the ADC and corresponding figures provide block diagrams and timing diagrams illustrating and describing the shared sub-ADC and sub-DAC.

Figure 1:
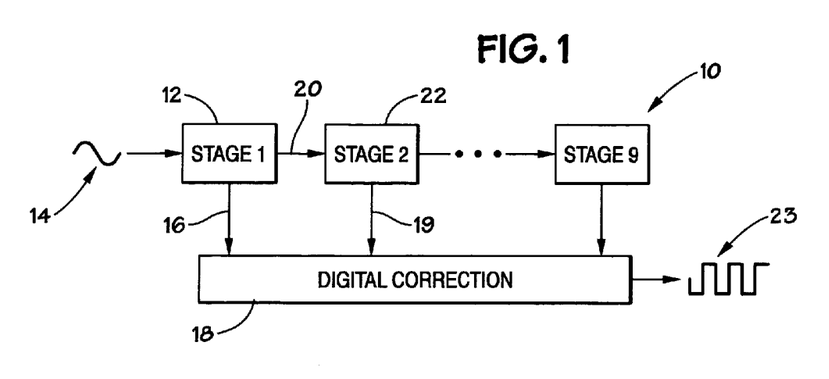
FIG. 1 illustrates a pipelined Analog-to-digital converter (ADC) in accordance with an exemplary embodiment of the present invention.

An exemplary pipelined ADC is illustrated in FIG. 1 and generally designated by the reference number 10. As illustrated, the pipelined ADC 10 may have multiple stages. The combined output of the various stages provides a digital output. The total number of stages included in an actual implementation may vary based on a variety of factors. Generally, more stages can provide higher resolution, or a digital signal with more bits. Some factors that may be considered in determining the number of stages include, for example, cost constraints, available layout area, and desired resolution.

The first stage 12 of the pipelined ADC 10 performs a coarse initial conversion of an analog signal 14. The first stage 12 quantizes the analog signal 14 and provides a digital output 16 to a digital correction module 18. The resolution of the digital output 16 provided to the digital correction module 18 may vary and may be determined based on desired operation parameters that may be application specific. For example, the digital output signal 16 may be a 2 bit signal or a 4 bit signal depending upon the desired operation parameters. Power consumption, for example, may be one consideration when determining per stage resolution in a pipelined architecture. Generally, the higher the resolution per stage, the higher the power consumption. Therefore, more power will be consumed in achieving a 4 bit resolution per stage than achieving a 2 bit resolution per stage.

A residual signal 20 is also output from the first stage 12. The second stage 22 receives the residue signal 20 from the first stage 12 and performs the same procedure as performed by the first stage 12. The residue signal 20 is an analog signal representing the difference between the analog signal 14 input to the first stage 12 and the digital signal 16, as will be explained in greater detail below. The second stage 22 quantizes the residual signal 20 and provides digital bits 19 to the digital correction module 18. Additionally, the second stage 22 provides a residual signal to a subsequent stage, where the procedure is repeated.

The digital correction module 18 combines the outputs of all of the stages of the pipelined ADC 10 and provides a digital output signal 20. Because each stage performs a conversion at a different point in time, the digital correction module 18 aligns the various bits received from the various stages. For example, the digital correction module 18 may use shift registers to time-align the bits from the various stages. Additionally, the digital correction module 18 checks the bits received from the stages to make sure there are no errors. For example, the digital correction module 18 may employ error correction techniques to correct any possible errors from being output in a digitized signal 23. Furthermore, the use of digital error correction by the digital correction module 18 reduces the accuracy requirements of the various stages.

Figure 2:
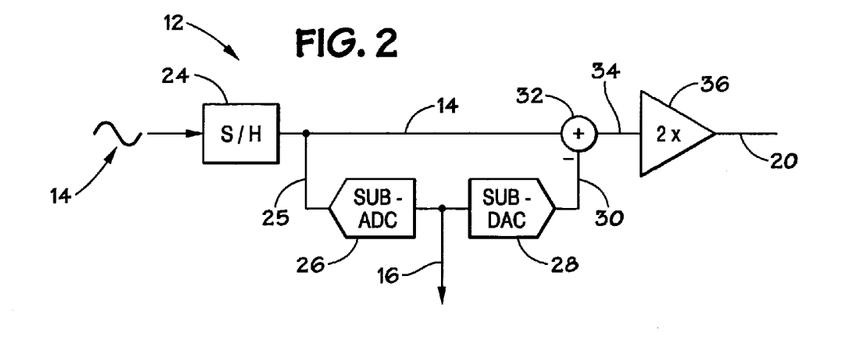
FIG. 2 illustrates a block diagram of the first stage of the pipelined ADC of FIG. 1 in accordance with an exemplary embodiment of the present invention.

A more detailed illustration of the first stage 12 is shown in FIG. 2. The analog signal 14 is shown entering a sample/hold (S/H) circuit 24. The S/H circuit 24 samples the analog signal 14 and during a hold cycle, a sub-ADC 26 performs the quantization on the held analog signal 14. The sub-ADC 26 then provides a digital output 16 to the digital correction module 18 (FIG. 1). A sub-DAC 28 receives the digital output 16 of the sub-ADC 26. The sub-DAC 28 converts the output signal into an analog signal 30 which is provided to a summing circuit 32. The summing circuit 32 subtracts the analog signal 30 from the held analog signal 14. The difference signal 34 is provided to an amplifier 36 before being provided as the residue signal 20 to the second stage 22 (FIG. 1).

Figure 3:
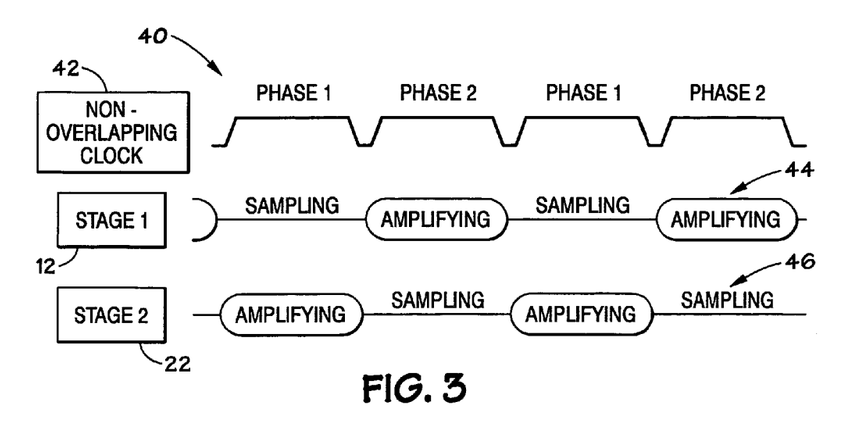
FIG. 3 illustrates a timing diagram of a pipelined ADC in accordance with an exemplary embodiment of the present invention.

An exemplary timing diagram for the pipelined ADC 10 of FIG. 1 is illustrated in FIG. 3 and is generally designated by the reference numeral 40. The uppermost signal in the diagram 40 is a non-overlapping clock 42. The middle signal 44 represents the state of the first stage 12 of the pipelined ADC 10, and the lower signal 46 represents the state of the second stage 22 of the pipelined ADC 10. As can be seen, the first stage 12 is in a sampling state while the second stage 22 is in an amplifying state. Specifically, during phase 1, the first stage 12 is in a sampling state, and the second stage 22 is in an amplifying state. Alternatively, during phase 2, the first stage 12 is in an amplifying state and the second stage 22 is in a sampling state.

Figure 4:
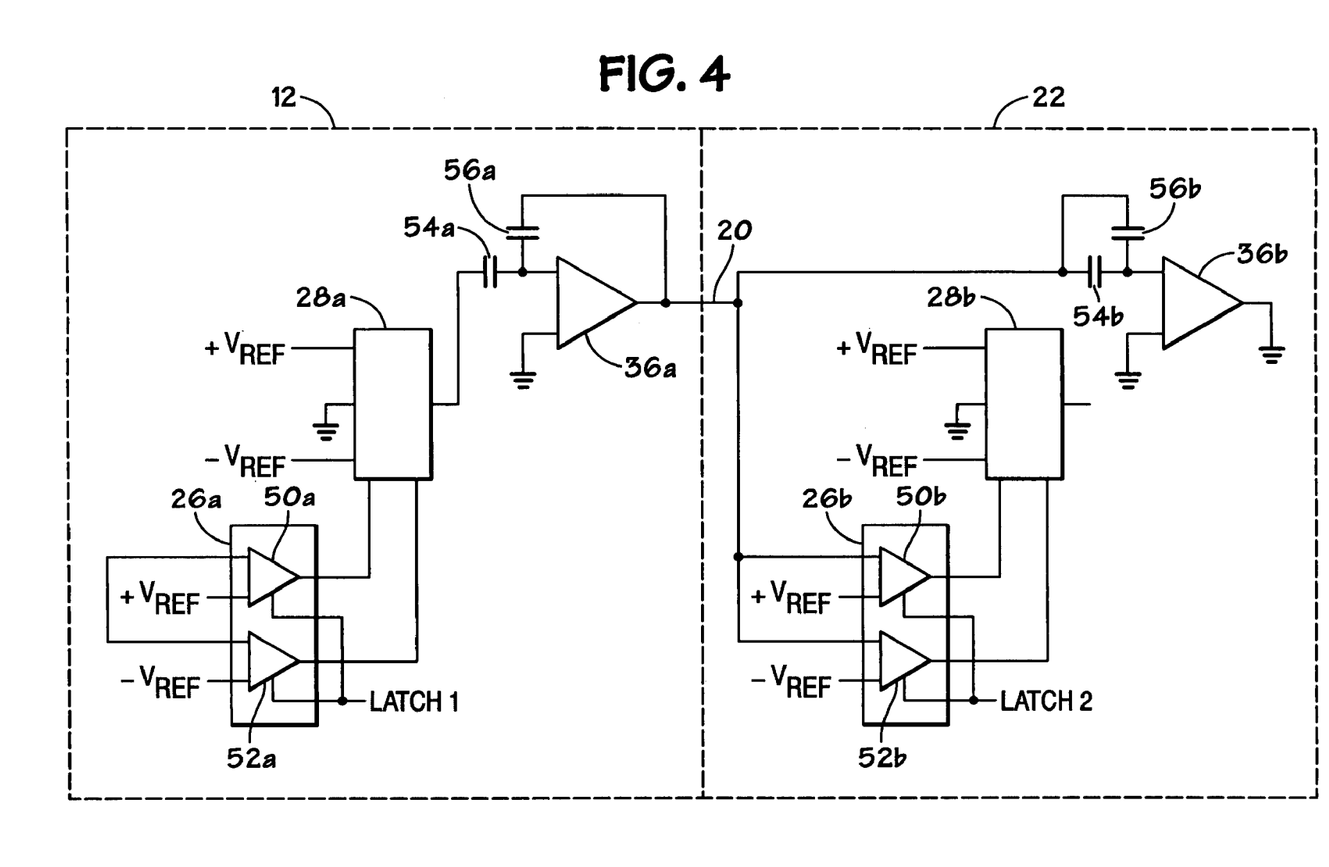
FIG. 4 illustrates a block diagram of two stages of the pipelined ADC of FIG. 1 with a first stage in an amplifying state and a second stage in a sampling state in accordance with an exemplary embodiment of the present invention.
Figure 5:
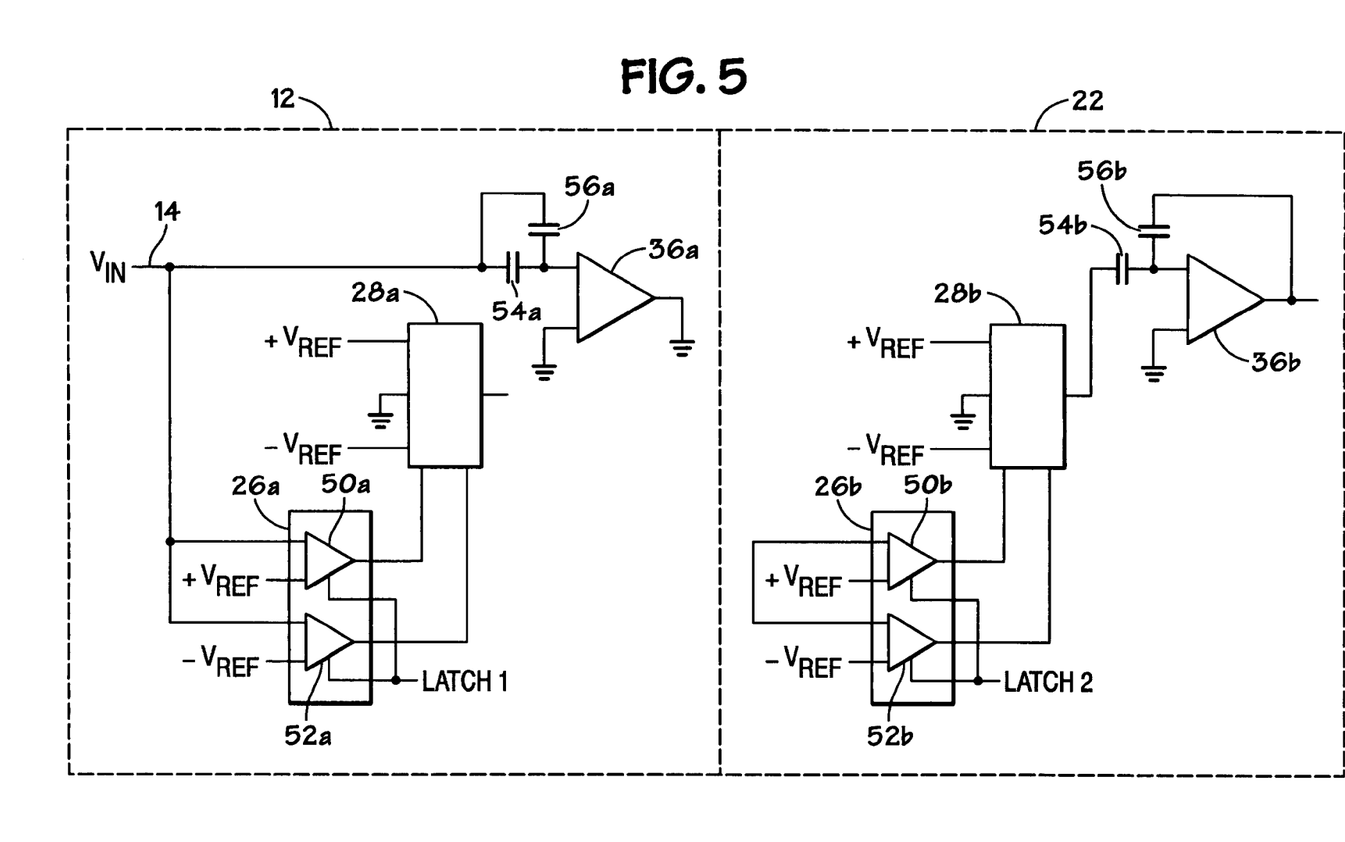
FIG. 5 illustrates a block diagram of two stages of the pipelined ADC of FIG. 1 with first stage in a sampling state and a second stage in an amplifying state in accordance with n exemplary embodiment of the present invention.

Turning to FIGS. 4 and 5, the operation of the first and second stages 12 and 22, respectively, are illustrated during amplifying and sampling states for each stage. Specifically, FIG. 4 illustrates the first stage 12 during an amplifying state and the second stage 22 in a sampling state, while FIG. 5 illustrates the first stage 12 during a sampling state and the second stage 22 in an amplifying state. FIG. 4, therefore, illustrates Phase 2 of the timing diagram 40 of FIG. 3, while FIG. 5 illustrates Phase 1.

As can be seen, in FIGS. 4 and 5, the first stage 12 and second stage 22, respectively, have identical components. Specifically, they each have a sub-ADC 26, a sub-DAC 28, and an amplifier 36. The sub-ADC 26 has a first comparator 50, and a second comparator 52. For clarity, the components of the first stage 12 are designated by the corresponding reference numeral and an alphabetic character, "a" (e.g., 26*a*, 28*a*, 36*a*, 50*a*, 52*a*, etc.), while the components of the second stage 22 are designated by the corresponding reference numeral and an alphabetic character, "b" (e.g., 26*b*, 28*b*, 36*b*, 50*b*, 52*b*, etc.).

As illustrated in FIG. 5, both the first comparator 50*a* and the second comparator 52*a* of the first stage 12 receive a Vin signal during the sampling state. The Vin signal is the original analog signal 14 that is to be converted to a digital signal by the pipelined ADC 10 of FIG. 1. Alternatively, as illustrated in FIG. 4, the first comparator 50*b* and the second comparator 52*b* of the second stage 22 receive a residue signal 20 from the first stage during its sampling state. In addition to the Vin signal received by the first stage 12 and the residue signal 20 received by the second stage 22, the first comparators 50 receive a +Vref signal (reference voltage) and the second comparators 52 receive a −Vref signal.

Additionally, a latch (not shown) may be provided in conjunction with the first comparators 50 and second comparators 52. The latch may be a flip-flop configured to capture the output of the first comparators 50 and second comparators 52 on a rising edge of a latch signal such as Latch 1 or Latch 2. The output of the latch is provided to the sub-DAC 28. The output of the latch does not change until it again captures the output of the comparators 50 and 52 on the next rising edge of a latch signal. Thus, the output of the latch may differ from a signal received at the inputs of the sub-ADC 26.

The sub-DAC 28 may be a 3:1 multiplexer which receives as inputs, a +Vref, a −Vref, and a ground or zero signal. The outputs of the sub-ADC 26 control the output of the sub-DAC 28. Specifically, the sub-DAC 28 outputs a +Vref, a −Vref, or a zero signal according to the outputs received from the sub-ADC 28. The output from the sub-DAC 28 defines a crow-bar level, as will be discussed in greater detail below.

The amplifier 36 may be coupled to capacitors in order to create a desired amplified output from the stage. In accordance with an exemplary embodiment illustrated in FIGS. 4 and 5, a first capacitor 54 and a second capacitor 56 may be coupled to the input of the amplifier 36. The first capacitor 54 receives the output from the sub-DAC 28 during an amplifying state and receives Vin during a sampling state. The Vin may be the original analog signal, or an output from the immediately preceding stage, as previously described.

The second capacitor 56 may also alternate between configurations according to whether it is an amplifying state or a sampling state. During a sampling state, the second capacitor 56 may be in an electrically parallel configuration with regards to the first capacitor 54. During an amplifying state, alternatively, the second capacitor may be coupled to the output of the amplifier 36 in order to provide a feedback loop. The alternating configurations of the second capacitor 56 may be seen in FIGS. 4 and 5, and will be described below.

Referring specifically to FIG. 4, the first stage 12 is illustrated in an amplifying state and the second stage 22 in a sampling state. During the sampling state of the second stage 22, the output 20 of the first stage 12 is provided to the first capacitor 54*b* and the second capacitor 56*b*. The first and second capacitors 54*b* and 56*b* are charged by the output 20 of the first stage 12, thus, the total charge sampled is two times the output 20. Additionally, the output 20 is provided to the sub-ADC 26b of the second stage 22. During the sampling state, no signal from the amplifier 36b is provided to a subsequent stage.

Concurrent with the sampling state of the second stage 22, the first stage 12 is in an amplifying state, as illustrated in the timing diagram 40 of FIG. 3. As will be appreciated, the capacitors 54a and 56a were charged by the Vin signal during a previous sampling state. During the amplifying state second capacitor 56a is configured to provide a feedback factor for the amplifier 36a. Assuming the capacitors 34a and 36a have approximately the same value, the feedback value is 1/2 Vin and the output signal would be two times Vin if no other elements were present.

The sub-ADC 26 and the sub-DAC 28, however, define a crow-bar level for the output of the first stage, during the amplifying state. The sub-DAC 28 which provides an output signal to the charged first capacitor 54a. The output of the sub-DAC 28 depends upon the sampled signal. Specifically, the output signal of the sub-DAC 28 is a +Vref signal if the sampled Vin signal is greater than ¼ Vref, a −Vref if the sampled Vin signal is less than −¼ Vref, and a zero signal if the sampled Vin is less than ¼ Vref but greater than −¼ Vref. This output of the sub-DAC 28a is negatively summed with the charge of the first and second capacitors 54a and 56a.

Accordingly, the output of the amplifier 36a is equal to (2*Vin)−Vref if the Vin is greater than ¼ Vref, (2*Vin)+Vref if Vin is less than −¼ Vref, and is (2*Vin) when Vin is greater than ¼ Vref but less than −¼ Vref. Table 1 summarizes the possible Vin conditions, the output of the sub-DAC, and the crow-bar level.

TABLE 1

| Condition | Vin < −¼ Vref | −¼Vref < Vin < ¼Vref | Vin > ¼Vref |
| --- | --- | --- | --- |
| Output of sub-DAC | −Vref | Zero signal | +Vref |
| Output of Amplifier | (2 * Vin) + Vref | 2 × Vin | (2 * Vin) − Vref |

Turning to FIG. 5, the first stage 12 is illustrated during a sampling state and the second stage 22 is shown in an amplifying state. As can be seen, the configuration of the first and second stages 12 and 22 is different from the configuration in FIG. 4. Specifically, the first stage 12 is coupled to the analog signal Vin, as explained earlier because this is the first stage 12 Vin represents the analog signal 14. The comparators 50a and 52a sample the Vin signal and the capacitors 54a and 56a are charged by the Vin signal. The sub-DAC 28a and the amplifier 36a do not provide output signals during the sampling state.

The second stage 22 operates in the amplifying state while the first stage 12 operates in the sampling state. The first capacitor 54b receives an output signal from the sub-DAC 28b and the amplifier 36b provides an output to a subsequent stage (not shown). Each stage alternates operating in sampling and amplifying states according to the timing diagram 40 illustrated in FIG. 3.

Figure 6:
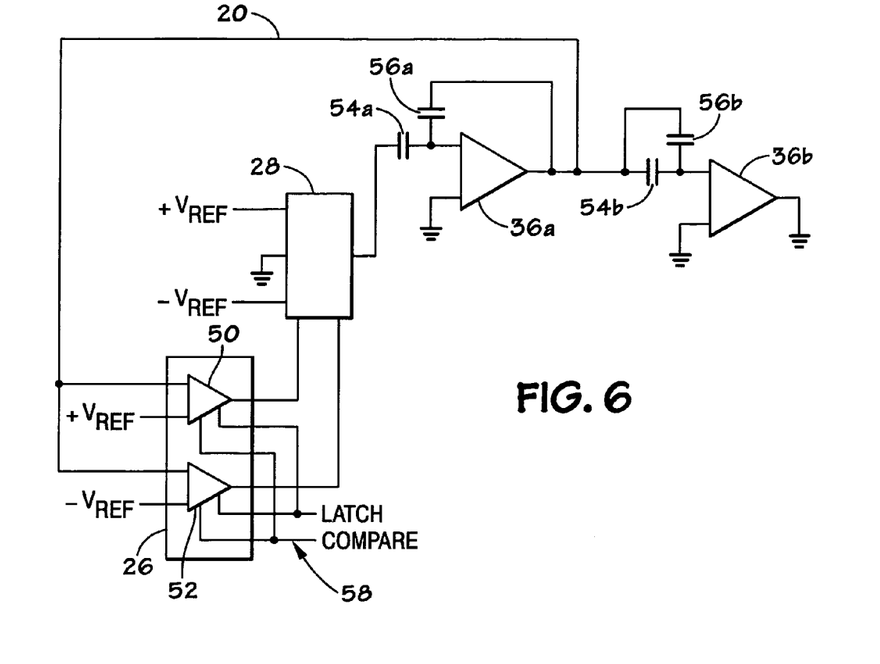
FIG. 6 illustrates a block diagram of a sub ADC/DAC having a shared sub-ADC and a shared sub-DAC, wherein a first stage is in an amplifying state and a second stage is in a sampling state in accordance with an exemplary embodiment of the present invention.
Figure 7:
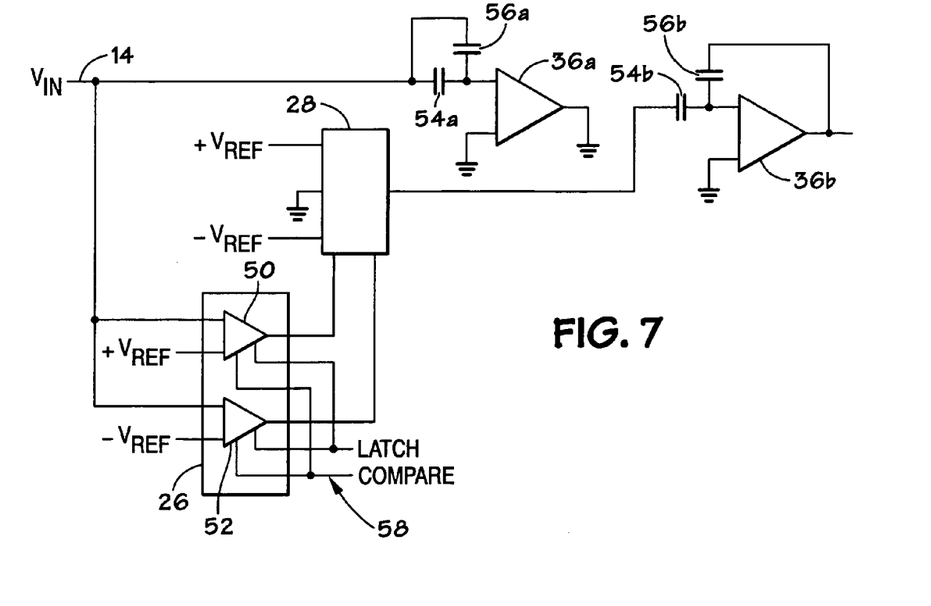
FIG. 7 illustrates a block diagram of FIG. 6 having a first stage in an amplifying state and a second stage in a sampling state in accordance with an exemplary embodiment of the present invention.

In accordance with embodiments of the present invention, the components of the first stage 12 and the second stage 22 are shared as illustrated in FIGS. 6 and 7. Specifically, the sub-ADC 26 and the sub-DAC 28 are shared between the first stage amplifier 36a and the second stage amplifier 36b in order to reduce layout area of a pipelined ADC.

In FIG. 6, the first stage amplifier 36a is shown in an amplifying state and the second stage amplifier 36b is shown in a sampling state. As can be seen, the first capacitor 54a of the first stage 12 is coupled to the output of the sub-DAC 28, while the second capacitor 56a provides a feedback loop for the amplifier 36a. Because the second stage amplifier 36b is in a sampling state, a residual signal 20 from the output of amplifier 36a is provided to the first and second capacitors 54b and 56b of the second stage 22.

Additionally, the residual signal 20 is provided to the sub-ADC 26. A compare signal 58 triggers the comparators 50 and 52 to compare the output of the amplifier 36a to the +Vref and the −Vref signals. As previously explained, a Latch signal may be provided to indicate an output of the comparators 50 and 52 should be "latched" or held. The sub-ADC 26 may be configured to latch a signal on a rising edge of the Latch signal. As such, the sub-ADC is able to provide a previously sampled output from the comparators 50 and 52 to the sub-DAC 28 while the comparators receive a different signal.

Referring to FIG. 7, the first stage amplifier 36a is illustrated in a sampling state and the second stage amplifier 36b is illustrated in an amplifying state. Accordingly, a Vin signal, such as analog signal 14, is provided to the first and second capacitors 54a and 56a. Additionally, the Vin signal is provided to the sub-ADC 26. The output from the sub-DAC 28 is provided to the second stage 22. Specifically, the first capacitor 54b of the second stage 22 receives the output of the sub-DAC 28 and the second capacitor 56b provides a feedback loop for the amplifier 36b. The output of the amplifier 36b is provided to a subsequent stage in the pipelined ADC.

Figure 8:
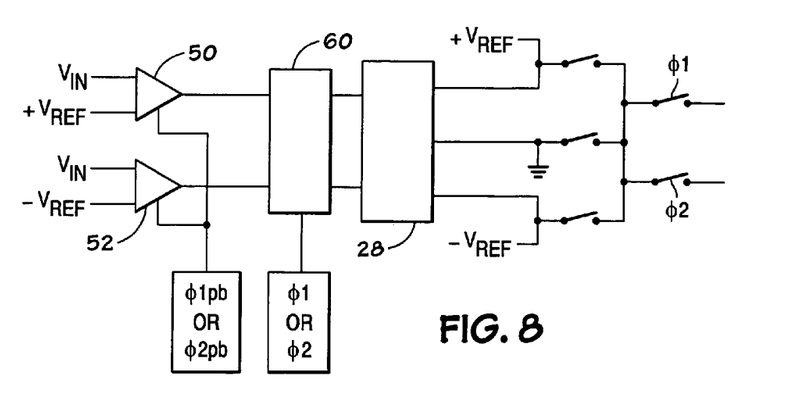
FIG. 8 illustrates a block diagram of two stages of a pipelined ADC configured to share a sub-ADC and a sub-DAC in accordance with an exemplary embodiment of the present invention.

An alternative illustration of the shared sub-ADC and sub-DAC in accordance with an exemplary embodiment of the present invention is shown in FIG. 8. As can be seen, the comparators 38 and 40 are configured to compare a Vin signal with +Vref and −Vref signals respectively. The outputs of the comparators 50 and 52 are provided to a latch 60. The latch 60 may be a flip-flop configured to capture the outputs of the comparators 50 and 52 on a rising edge of the Latch signal, as described above. The output of the latch 60 is provided to the sub-DAC 28. The sub-DAC 28 provides a +Vref, −Vref, or zero signal output, as previously described in greater detail, to provide a crow-bar level during an amplifying state. Switches Φ1 and Φ2 coupled to the output are controlled according to the timing diagram of FIG. 9 to provide the output from the sub-DAC to the proper stage.

Figure 9:
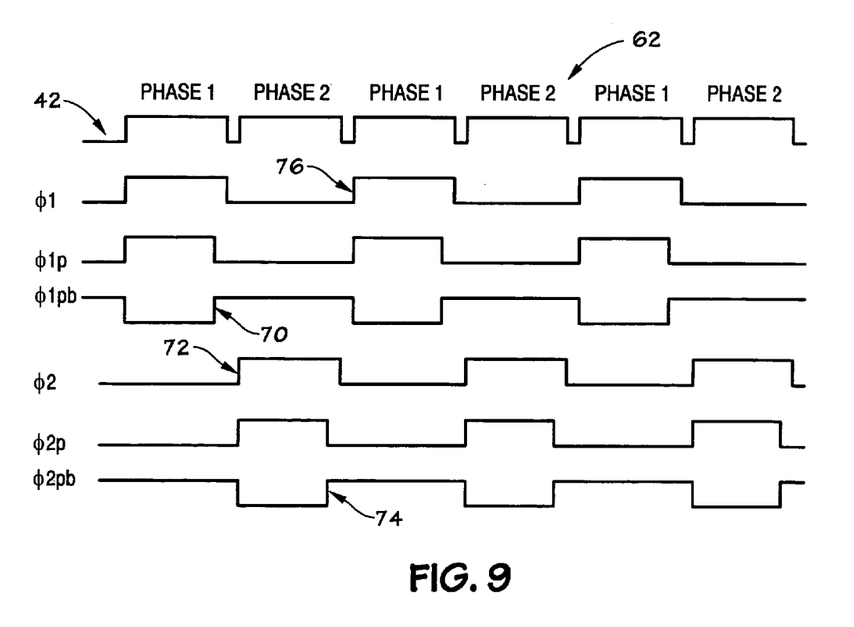
FIG. 9 illustrates a timing diagram of the block diagram of FIG. 6 in accordance with an exemplary embodiment of the present invention.

Turning to FIG. 9, a timing diagram corresponding to the operation of the components of FIG. 8 is illustrate and generally designated by the reference numeral 62. The timing diagram 62 illustrates a non-overlapping clock signal 42, and signals which correspond to timing of the components and switches of FIG. 8. The timing diagram 62 is provided for correspond to the implementation of a type II comparator. Alternative timing schemes may be necessary for alternative comparator types.

Signals Φ1 and Φ2 are provided to switch the output of the sub-DAC 28 from operating as the output of the first stage 12 to operating as the output of the second stage 22. Additionally, the signals Φ1 and Φ2 control the timing of the latch 60.

A Φ1pb signal and a Φ2pb signal are provided to control the reading in of Vin signals into the comparators 50 and 52. In accordance with one embodiment of the present invention, the rising edge of the Φ1pb signal indicates to the comparators 50 and 52 to trigger for a second stage 22. For example, at point 70, the comparators 50 and 52 receive a Φ1pb signal to read in a signal, such as the residue signal from stage 1, for stage 2. The rising edge of the Φ2 signal causes the latch to read in the output from the comparators 50 and 52. Specifically, at point 72, the latch 60 will capture the output from the comparators 50 and 52. The Φ2pb signal indicates to the comparator to compare a Vin signal for stage 1. For example, at point 74, the comparators will being comparing the Vin for stage 1. The rising edge of the Φ1 signal indicates the sub-DAC will output a signal to the amplifier of stage 1 via switch Φ1 of FIG. 8. Specifically, at point 76, the output of the sub-DAC is provided to the first stage 12. Additionally, the rising edge of the Φ1 signal indicates to the latch to read in the output of the comparators.

Figure 10:
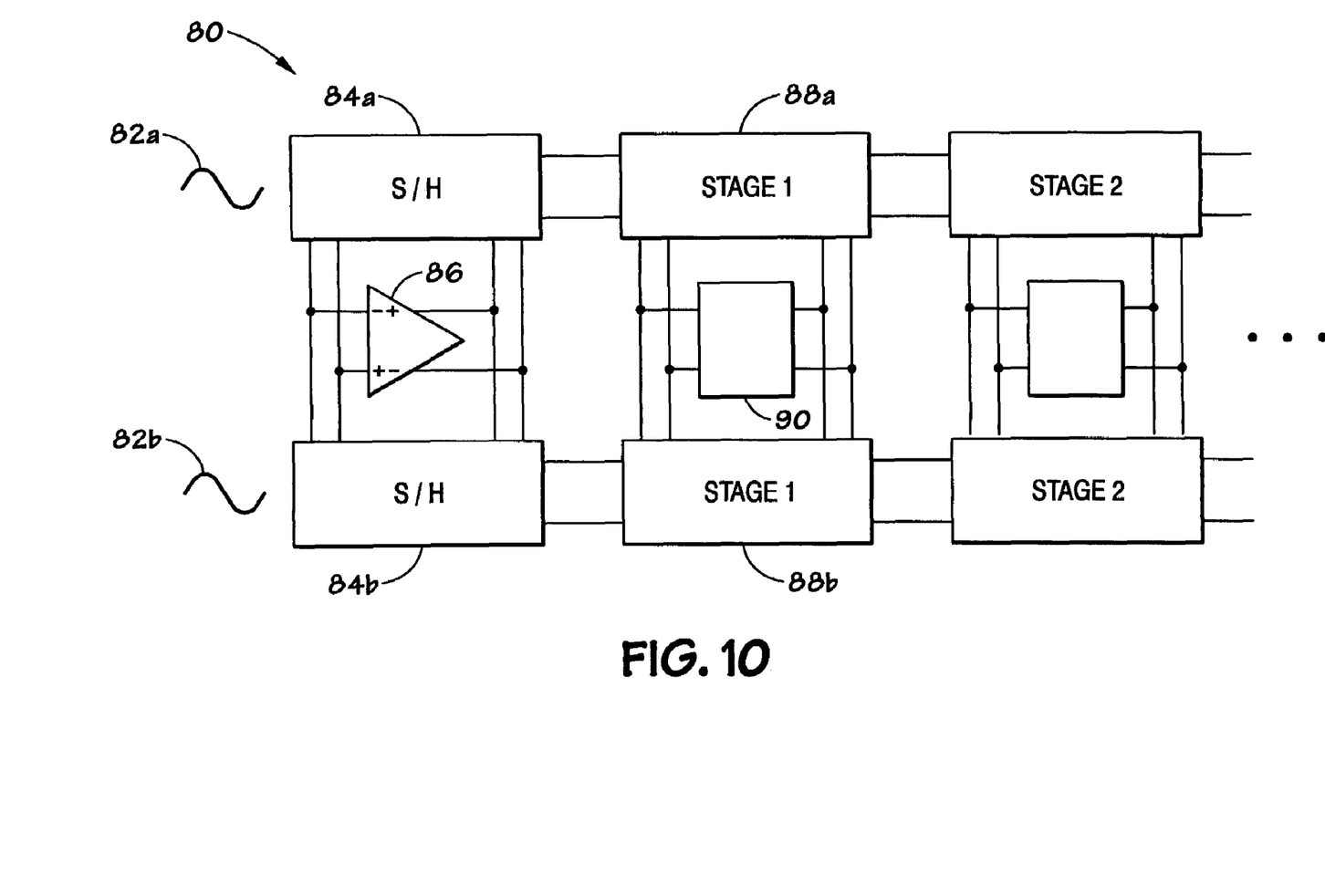
FIG. 10 illustrates a block diagram of a two-channel pipelined ADC in accordance with an alternative embodiment of the present invention.

Referring to FIG. 10, a block diagram of a two-channel pipelined ADC is illustrated in accordance with an alternative embodiment of the present invention and is generally designated by the reference numeral 80. As its name suggests, the two-channel pipelined ADC 80 has a dual channel configuration with two channels configured to operate simultaneously in parallel. Other alternative embodiments may utilize more channels, such as four channels, for example, configured to operate simultaneously.

The two-channel pipelined ADC 80 is configured to receive two signals, one for each channel. Specifically, a first signal 82a and a second signal 82b are sampled by the sample and hold circuits 84a and 84b. The sample and hold circuits 84a and 84b may share components. Specifically, as shown in FIG. 10, the sample and hold circuits 84a and 84b may share an amplifier 86.

The signals 82a and 82b are provided from the sample and hold circuits 84a and 84b to the first stage of the first channel 88a and first stage of the second channel 88b, respectively. The first stage of the first channel 88a and the first stage of the second channel 88b may share components as illustrated by block 90. Specifically, the first stage of the first channel 88a and the first stage of the second channel 88b may share sub-ADC components, sub-DAC components, and an amplifier. The sharing of an amplifier between the two channels reduces the requirement of the amplifier and therefore reduces the power consumed by the dual channel pipelined ADC 80.

In alternative embodiments, an amplifier may be shared between channels, while sub-ADC and sub-DAC components are shared between adjacent stages within a channel. The operation of the shared components between channels is similar to the operation of the shared sub-ADC and sub-DAC described in detail above with reference to FIGS. 4-7. Specifically, the shared components will alternate sampling and processing the first signal 82a for the first stage of the first channel 88a and sampling and processing the second signal 82b for the first stage of the second channel 88b. Subsequent stages of the two-channel pipelined ADC may be configured to operate in a similar manner.

A method and apparatus for an ADC having a reduced layout area has been described above. The layout area is reduced by sharing sub-ADC and sub-DAC components between two consecutive stages or between two stages in two channels. The layout area saved is realized to a greater extent in the pipelined ADC architecture, where multiple pairs of stages share components.

While embodiments of the invention may be susceptible to various modifications and alternative forms, specific embodiments have been shown by way of example in the drawings and have been described in detail herein. However, it should be understood that the invention is not intended to be limited to the particular forms disclosed. Rather, embodiments of the invention are to cover all modifications, equivalents, and alternatives falling within the spirit and scope of these embodiments, as defined by the following appended claims.

What is claim is:

1. A pipelined analog-to-digital converter (ADC) device comprising:
   a first stage; and
   a second stage, wherein the first and second stages are configured to share a sub-ADC and a sub-digital-to-analog (DAC) converter, wherein the first and second stage each comprises a first capacitor and a second capacitor coupled to an input of an operational amplifier, and wherein the second capacitor is coupled in parallel with the first capacitor to an analog input during a sampling state to an analog input during a sampling state.

2. The pipelined ADC device of claim 1, wherein a single channel comprises each of the first and second stages.

3. The pipelined ADC device of claim 1, further comprising a multi-channel pipelined ADC having each of a first channel and a second channel wherein the first channel comprises the first stage and wherein the second channel comprises the second stage.

4. The pipelined ADC device of claim 1, wherein the first and second stages share an operational amplifier.

5. The pipelined ADC of claim 1, wherein the sub-ADC comprises a plurality of comparators.

6. The pipelined ADC of claim 1, wherein the sub-DAC comprises a 3-to-1 multiplexer.

7. The pipelined ADC of claim 1, wherein the first capacitor is coupled to the output of the sub-DAC during an amplifying state and coupled to an analog input during the sampling state.

8. The pipelined ADC of claim 1, wherein the second capacitor is coupled to the output of the operational amplifier during an amplifying state.

9. A device for converting an analog signal to a digital signal comprising:
   a first stage comprising:
      a sub-analog-to-digital converter (sub-ADC);
      a latch configured to receive the output of the sub-ADC;
      a sub-digital-to-analog converter (sub-DAC) configured to receive an output from the latch; and
      a first amplifier configured to receive the output of the sub-DAC;
   a second stage configured to receive an output of the first amplifier, the second stage comprising:
      the sub-ADC of the first stage;
      the sub-DAC of the first stage; and
      a second amplifier; and
   a first capacitor and a second capacitor coupled to the first amplifier; and
   a third capacitor and a fourth capacitor coupled to the second amplifier, wherein during an amplifying state of the respective stages, the first and third capacitors are configured to couple to the output of the sub-DAC and the second and fourth capacitors are configured to couple to an output of the first and second amplifiers respectively.

10. The device of claim 9, wherein the second stage receives a residue signal from the first stage.

11. The device of claim 9, wherein the device is a multi-channel pipelined ADC and the first and second stages are in different channels.

12. The device of claim 9, wherein the latch comprises a flip-flop.

13. The device of claim 9, wherein during a sampling state of the respective stages, the first, second, third, and fourth capacitors are configured to receive an input signal.

14. The device of claim 9, wherein the first and second amplifiers are the same type amplifier.

15. The device of claim 9, comprising a digital correction module configured to receive an output of the sub-ADC.

16. The device of claim 9, wherein the sub-ADC comprises comparators.

17. The device of claim 9, wherein the sub-DAC comprises a multiplexer.

18. A method of converting an analog signal to a digital signal comprising:
   operating a first stage of a converter in a sampling state, wherein the sampling state comprises:
      sampling and holding an analog signal;
      providing the analog signal to a first and second capacitor; and
      converting the analog signal to a digital signal using a sub-analog to digital converter (ADC);
   operating a second stage of the converter in an amplifying state, wherein the amplifying state comprises:
      converting a digital output of a sub-ADC to an analog signal using a sub- digital to analog signal (DAC); and
      producing a residue signal;
      simultaneously operating the first stage in the amplifying state and the second stage in the sampling state, wherein the sub-ADC and the sub-DAC are shared by the first and second stages.

19. The method of claim 18, comprising providing a residue signal from the first stage to the second stage.

20. The method of claim 18, comprising operating the first stage and the second stage in separate channels.

21. The method of claim 18, comprising providing control signals to the first stage and the second stage.

22. The method of claim 21, wherein providing control signals to the first stage and the second stage comprise:
   providing a compare signal to comparators of a sub-ADC; and
   providing a latch signal to a flip-flop coupled to the output of the sub-ADC.

23. The method of claim 18, comprising sharing an operational amplifier between the first stage and the second stage.

24. A pipelined analog-to-digital converter (ADC) comprising:
   a first channel comprising:
      multiple adjacent stages, wherein a first stage of the first channel and a second stage of the first channel share a sub-ADC and a sub-DAC, the sub-ADC comprising a pair of comparators controlled by first and second timing signals; and
      a latch coupled between the sub-ADC and the sub-DAC, wherein the latch is controlled by third and fourth timing signals; and
   a second channel comprising multiple adjacent stages, wherein the first stage of the first channel and a first stage of a second channel share an amplifier.

25. The pipelined ADC of claim 24, comprising a switch coupled to the output of the sub-DAC, the switch controlled by the third and fourth timing signals and configured to provide the output of the sub-DAC to a subsequent stage.

* * * * *

UNITED STATES PATENT AND TRADEMARK OFFICE
CERTIFICATE OF CORRECTION

PATENT NO. : 7,471,227 B2  Page 1 of 1
APPLICATION NO. : 11/506702
DATED : December 30, 2008
INVENTOR(S) : Cho It is certified that error appears in the above-identified patent and that said Letters Patent is hereby corrected as shown below:

In column 8, lines 7-8, in Claim 1, after "capacitor" delete "to an analog input during a sampling state to an analog input during a sampling state." and insert -- to an analog input during a sampling state. --, therefor.

Signed and Sealed this

Twenty-fourth Day of March, 2009

JOHN DOLL
*Acting Director of the United States Patent and Trademark Office*